United States Patent
Warnes et al.

(10) Patent No.: US 6,194,026 B1
(45) Date of Patent: *Feb. 27, 2001

(54) SUPERALLOY COMPONENT WITH ABRASIVE GRIT-FREE COATING

(75) Inventors: Bruce M. Warnes, Muskegon; John E. Schilbe, Whitehall; Alexander J. Nordin, Hesperia; Joel L. Cockerill, Montague, all of MI (US)

(73) Assignee: Howmet Research Corporation, Whitehall, MI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/174,716

(22) Filed: Oct. 19, 1998

(51) Int. Cl.$^7$ .................................................. B05D 3/10
(52) U.S. Cl. ..................... 427/180; 427/343; 427/435; 134/2; 134/7
(58) Field of Search ..................... 427/180, 203, 427/343, 435; 134/2, 7, 13; 419/26

(56) References Cited

U.S. PATENT DOCUMENTS

| | | | |
|---|---|---|---|
| 4,130,157 | * 12/1978 | Miller et al. | |
| 4,141,781 | 2/1979 | Greskovich et al. | 156/637 |
| 4,289,541 | 9/1981 | Wallner et al. | 134/7 |
| 4,439,241 | 3/1984 | Ault et al. | 134/22.17 |
| 4,600,443 | 7/1986 | Basalyk et al. | 134/3 |
| 4,877,638 | 10/1989 | Novak et al. | 427/8 |
| 5,332,023 | * 7/1994 | Mills | 164/132 |
| 5,507,306 | * 4/1996 | Irvine et al. | 134/166 |
| 5,678,583 | * 10/1997 | Conroy et al. | 134/133 |
| 5,679,270 | * 10/1997 | Thornton et al. | 216/1 |
| 5,685,917 | 11/1997 | Sangeeta | 134/2 |
| 5,706,881 | 1/1998 | Grunstra et al. | 164/76.1 |
| 5,915,452 | * 6/1999 | Conroy et al. | 164/345 |

FOREIGN PATENT DOCUMENTS

3537351 * 10/1985 (DE).
872024 * 10/1981 (SU).

* cited by examiner

*Primary Examiner*—Fred J. Parker

(57) ABSTRACT

Manufacture of superalloy component wherein the component is blasted with abrasive grit particles at one or more stages during the manufacture, is treated with a chemical grit removal medium effective to dissolve and remove abrasive grit particles from the surface of the component without degradation of the component (substrate), and then is coated with a protective coating such that entrapped grit particles are substantially reduced or eliminated from the coating.

14 Claims, 6 Drawing Sheets

90 Al$_2$O$_3$ @ 80 psi BEFORE KOH CLEANING

90 Al$_2$O$_3$ @ 80 psi AFTER KOH CLEANING

FIG. 1(A)  16 Al₂O₃ @ 80 psi BEFORE KOH CLEANING

FIG. 1(B)  16 Al₂O₃ @ 80 psi AFTER KOH CLEANING

FIG. 2(A) 90 Al₂O₃ @ 80 psi BEFORE KOH CLEANING

FIG. 2(B) 90 Al₂O₃ @ 80 psi AFTER KOH CLEANING

FIG. 3(A) 220-240 Al₂O₃ @ 80 psi BEFORE KOH CLEANING

FIG. 3(B) 220-240 Al₂O₃ @ 80 psi AFTER KOH CLEANING

220/240 Al$_2$O$_3$ @ 50 psi MDC 210 (CVD) BEFORE KOH CLEANING
FIG. 4(A)

220/240 Al$_2$O$_3$ @ 50 psi MDC 210 (CVD) AFTER KOH CLEANING
FIG. 4(B)

FIG. 5(A) 16 $Al_2O_3$ @ 80 psi BEFORE KOH CLEANING

FIG. 5(B) 16 $Al_2O_3$ @ 80 psi AFTER KOH CLEANING

FIG. 6(A) 16 Al₂O₃ @ 80 psi BEFORE KOH CLEANING

FIG. 6(B) 16 Al₂O₃ @ 80 psi AFTER KOH CLEANING

SUPERALLOY COMPONENT WITH ABRASIVE GRIT-FREE COATING

FIELD OF THE INVENTION

The present invention relates to manufacture of coated superalloy components, such as aluminide or MCrAlY overlay coated gas turbine engine blades and vanes, wherein the superalloy components are grit blasted during manufacture and treated to remove embedded grit particles prior to subsequent coating operations such that the coating is substantially free of entrapped grit particles.

BACKGROUND OF THE INVENTION

Abrasive media blasting using aluminum oxide, silicon dioxide and other grit particles is a commonly used processing step in the manufacture of nickel, cobalt and iron base superalloy gas turbine engine hardware, such as turbine blades and vanes, by casting and protectively coating the casting. Examples of processing or manufacturing operations using abrasive grit blasting include a) ceramic shell mold removal from the casting using coarse (e.g. 90 grit or larger) grit particles at high carrier air pressure (e.g. 60–90 psi), b) surface cleaning of the casting using fine (e.g. 220 grit or smaller) particles at moderate carrier air pressure (e.g. 40–60 psi) prior to aluminizing to form a protective coating, c) roughening a casting surface using fine grit at moderate carrier air pressure prior to platinum or other electroplating operation, or d) roughening a casting surface using large grit at high carrier air pressure prior to overlay coating deposition by plasma or flame spraying or EB-PVD (electron beam-physical vapor deposition). Abrasive grit blasting unfortunately results in grit particles, such as alumina grit particles, becoming embedded as contaminants in the blasted surface of the superalloy component. In general, the severity of surface contamination with embedded grit particles increases with the carrier air pressure and the angle of incidence of the abrasive blast media relative to the casting surface.

Embedded abrasive oxide grit particles in protective diffusion aluminide or MCrAlY overlay coatings can have a detrimental effect on the performance of the coatings. Specifically, embedded grit particles can concentrate stresses (thermal and/or mechanical) applied to the coated engine component, and such stress concentration can result in cracking of the coating and/or the component. In addition, embedded grit particles can adversely affect the adherence of either outwardly grown diffusion aluminide coatings or MCrAlY overlay coatings of the known type (where M is Ni and/or Co and/or Fe), particularly when small grit particles cover a significant fraction of the surface area of the component prior to coating. Because of the undesirable effects of entrapped grit oxide particles, most gas turbine engine manufacturers limit the size and quantity of embedded grit particles permissible in protective coatings. Consequently, processes have been included in manufacture of such components as turbine blades and vanes to control surface contamination from embedded abrasive grit particles. Such processes have included chemical etching of the component surface and fluoride ion cleaning among others.

Grit blasting is inexpensive and widely used in manufacture of such superalloy components as turbine blades and vanes. Frequently, multiple grit blasting operations are incorporated into the production routing of such superalloy components as turbine blades and vanes from shell mold removal to aluminizing. However, in order to reduce manufacturing costs and processing time, surface finishing operations to remove embedded grit particles may be reduced in number to an extent that there can be a chronic problem meeting the aforementioned specifications of gas turbine engine manufacturers with respect to size and quantity of embedded grit particles in protective coatings. Currently, fluoride ion cleaning, ferric chloride etching and ultrasonic cleaning are used to reduce the presence of embedded grit particles at the pre-aluminide coating and/or pre-electroplating stage of manufacture. However, none of these processes is without serious limitations. For example, grit removal using $HF/H_2$ mixtures at high temperature produces unacceptable alloy depletion in the component and involves considerable expense. Chemical etching of the component using ferric chloride is disadvantageous in that such etching attacks and removes a portion of the alloy surface itself, and so, reduces the component wall thickness. Ultrasonic cleaning is disadvantageous because it only removes some of the embedded particles.

There thus is a need for a process which can be incorporated into the manufacture of superalloy components to remove embedded grit particles effectively without degradation of the component. The present invention has an object to satisfy this need.

SUMMARY OF THE INVENTION

The present invention provides for manufacture of superalloy component wherein the component is blasted with abrasive grit particles at one or more stages during the manufacture, the grit particles are removed from the surface of the component by treating the surface with a chemical medium effective to chemically attack (e.g. completely or partially dissolve) the abrasive grit particles in a manner that allows their removal from the surface without substantially chemically attacking or degrading the component (substrate), and then is coated with a protective coating such that entrapped grit particles are substantially reduced or eliminated from the coating. The chemically treated component surface can be contacted with a fluid, such as rinse water, in a manner to assist in removal of any undissolved grit particles loosened from the surface by partial particle dissolution.

The present invention provides an abrasive grit blasted superalloy component having a coating that is substantially free of entrapped grit particles on a surface that is free of chemical attack.

In an illustrative embodiment of the present invention, the component can be a cast nickel or cobalt base superalloy blade or vane freed from ceramic shell mold material by a knock-out operation followed by abrasive grit blasting using coarse abrasive oxide grit particles at high carrier air pressure and then subsequently surface treated prior to coating by abrasive grit blasting. After surface treatment, the component is immersed in an inorganic hydroxide bath having a high concentration of alkali or alkaline earth hydroxide with the bath at ambient (atmospheric) pressure and elevated temperature, such as at least 275 degrees F., for a time sufficient to at least partially dissolve oxide grit particles embedded in the surface of the component followed by rinsing in water. The hydroxide bath can comprise an inorganic hydroxide solution having at least 50 weight % of an alkali or alkaline earth hydroxide and the balance essentially water. An exemplary inorganic hydroxide bath can comprise a 90 weight % KOH and 10 weight % water solution at 650 degrees F. disposed in a vessel open to atmospheric pressure.

The above and other objects and advantages of the present invention will become more readily apparent from the following drawings taken in conjunction with the following detailed description.

DESCRIPTION OF THE INVENTION

The present invention involves manufacture of a superalloy component wherein the component is abrasive grit blasted with abrasive grit particles at one or more stages during its manufacture. For example, in the manufacture of cast nickel, cobalt or iron base superalloy components, abrasive grit blasting is used to remove the ceramic shell mold remaining on the cast superalloy component after a conventional "knock-out" operation where the cast shell mold is struck in manner to break and remove much of the shell mold from the casting. After the "knock-out" operation, the casting with some ceramic shell mold still remaining on the surface of the casting is abrasive grit blasted using coarse (e.g. 90 grit or larger) alumina grit particles at high carrier air pressure (e.g. 60–90 psi) to remove the remaining shell mold material.

After the mold removal operation and other operations (e.g. localized grinding and heat treatment) and prior to aluminizing the cast superalloy component to form a simple diffusion aluminide coating thereon, the surface of the cast superalloy component typically is cleaned using fine (e.g. 220 grit or smaller) alumina grit particles at moderate pressure (e.g. 40–60 psi). The component then is aluminized by CVD, pack cementation, above-the-pack, slurry or electrophoritic process to form a diffusion aluminide coating on the component in accordance with well known aluminide coating techniques. Grit sizes referred to herein are pursuant to ANSI Specification B74.12.

In lieu of a simple aluminide coating, a platinum modified diffusion aluminide coating can be formed on the cast superalloy component. In this event, after the mold removal operation and aforementioned other operations and prior to coating of the cast superalloy component to form a platinum modified diffusion aluminide coating thereon, the surface of the cast component is roughened using fine alumina grit (e.g. 220 grit or smaller) at moderate air pressure (e.g. 40–60 psi) prior to a platinum electroplating operation to deposit platinum on the component. The platinum coated component then is aluminized to form the platinum modified diffusion aluminide coating in accordance with well known aluminide coating techniques, such as CVD aluminizing described in U.S. Pat. No. 5,658,614 for example.

In lieu of a diffusion aluminide coating, the cast superalloy component alternately may be coated with a conventional MCrAlY overlay coating where M is Ni and/or Co and/or Fe using the HVOF (high velocity oxygen fuel) or other flame spraying techniques, plasma spray, or EB-PVD. In this event, after the mold removal operation aforementioned other operations and prior to coating the cast superalloy component, the surface of the cast component is roughened using large alumina grit (e.g. 90 grit or larger) at high air pressure (e.g. 60–90 psi) so as to provide a surface receptive to the overlay coating as deposited by flame, plasma spraying or EB-PVD.

Regardless of the particular coating technique employed, the cast superalloy component that has been grit blasted at some point in time prior to coating is further treated by a chemical grit removal operation in accordance with the invention to substantially reduce or eliminate embedded grit particles from the surface of the component and thus the coating formed thereon. In particular, the cast superalloy component is contacted with a caustic media effective to partially or completely dissolve embedded abrasive grit particles to loosen or remove the particles on the surface of the component in short times and without degradation of the substrate or depletion of alloyants from the component (substrate), and then is coated with a protective coating such that entrapped grit particles are substantially reduced or eliminated from the coating.

For example, the cast superalloy component is immersed in or otherwise contacted with an inorganic hydroxide bath having a high concentration of alkali or alkaline earth hydroxide, such as KOH, NaOH, $Ca(OH)_2$, $Mg(OH)_2$, with the bath at ambient (atmospheric) pressure and elevated temperature, such as at least 275 degrees F., for a time sufficient to dissolve embedded alumina or other oxide grit particles in the surface of the component. The hydroxide bath can comprise an inorganic hydroxide solution having at least 50 weight % of an alkali or alkaline earth hydroxide and the balance essentially water. For purposes of illustration and not limitation, the inorganic hydroxide bath can comprise a 90 weight % KOH and 10 weight % water solution at 650 degrees F. disposed in a vessel open to atmospheric pressure. The component having the embedded oxide grit particles can be immersed for up to ten minutes and then immersed in a room temperature water rinse bath to help remove or flush the partially dissolved grit particles thereby loosened from the component surface.

The following examples are offered for purposes of further illustrating and not limiting the invention. In particular, removal of embedded abrasive grit particles from a superalloy component surface pursuant to the invention was demonstrated by two sample testing techniques which involved 1) using various sizes of abrasive grit at high air pressure (e.g. 80 psi) with a 90 degree angle of incidence on a variety of superalloys, both polycrystalline and single crystal, and 2) using production simulation processes on production superalloy test samples. The tests at high air pressure generally represented the worst case for grit entrapment, while the normal production parameters for diffusion aluminide coatings are the best case for grit entrapment.

The surfaces of the samples were examined with a scanning electron microscope (SEM) in both the as-grit blasted condition and the grit removed condition to determine both the extent of initial abrasive grit entrapment and the effectiveness of the grit removal treatment of the invention in dissolving embedded grit particles without attack of the substrate. In addition, metallographically prepared cross-sections of coated samples with and without the grit removal treatment were evaluated. Both low activity outwardly grown CVD diffusion aluminide coatings and CoNiCrAlY overlay coatings applied by HVOF were evaluated in the tests.

Test sample tabs for various grit sizes at high carrier air pressure were 1×½×⅛ inch in dimensions and comprised well known IN-100, MarM-247, and CMSX-4 nickel base superalloys. The tabs were blasted at 80 psi carrier air pressure and a 90 degree angle of incidence with 16, 90, and 220 mesh alumina grit particles using grit blasting equipment commercially available from Empire Blasting Corporation. Following this operation, SEM examination of the tab surfaces revealed significant amounts of embedded grit particles. Representative surface micrographs are shown in FIGS. 1A, 2A, and 3A for the 16, 90 and 220 grit blasted test tabs of MarM-247.

Figure 1B:
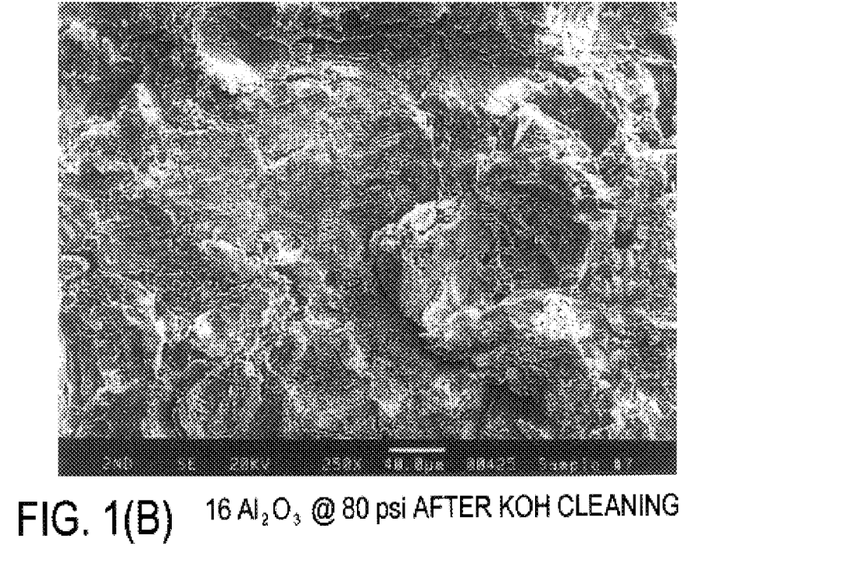

Subsequently, the grit blasted test tabs were treated by immersion in a molten KOH bath (90 weight % KOH and balance water) in a vessel open to the ambient air atmosphere at a bath temperature of 650 degrees F. For the 16 and 90 grit blasted test tabs, the treatment comprised two nine minute immersions in the KOH bath with a water rinse. For the 220 grit blasted test tabs, the treatment comprised one nine minute immersion in the KOH bath with a water rinse. Photomicrographs of the treated tab surfaces are shown in FIGS. 1B, 2B, and 3B for the 16, 90 and 220 grit blasted test tabs of MarM-247 after immersion in the KOH bath and water rinse.

Figure 1A:
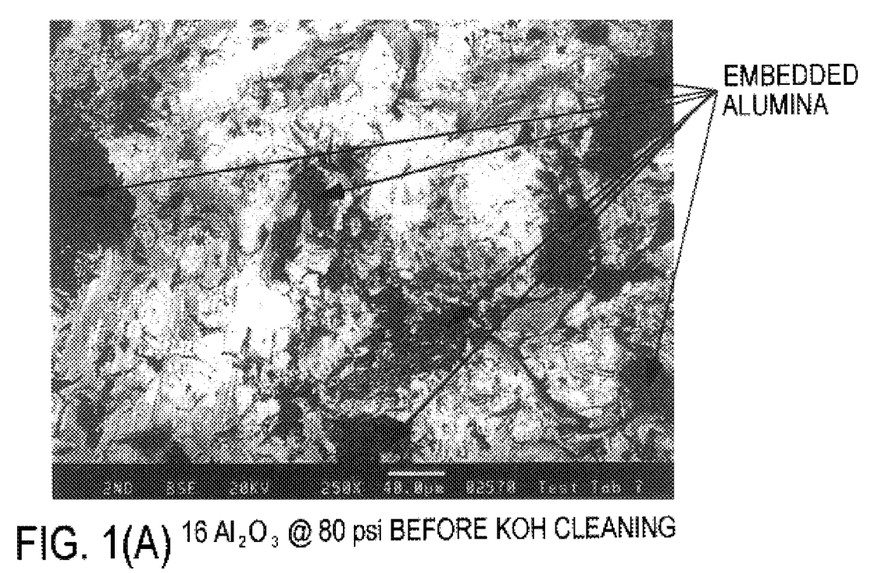
FIGS. 1A and 1B are photomicrographs at 250X of MarM-247 nickel base superalloy samples grit blasted at high air pressure using #16 alumina grit with FIG. 1A being before immersion and FIG. 1B being after immersion in a caustic grit removal bath pursuant to the present invention.
Figure 2A:
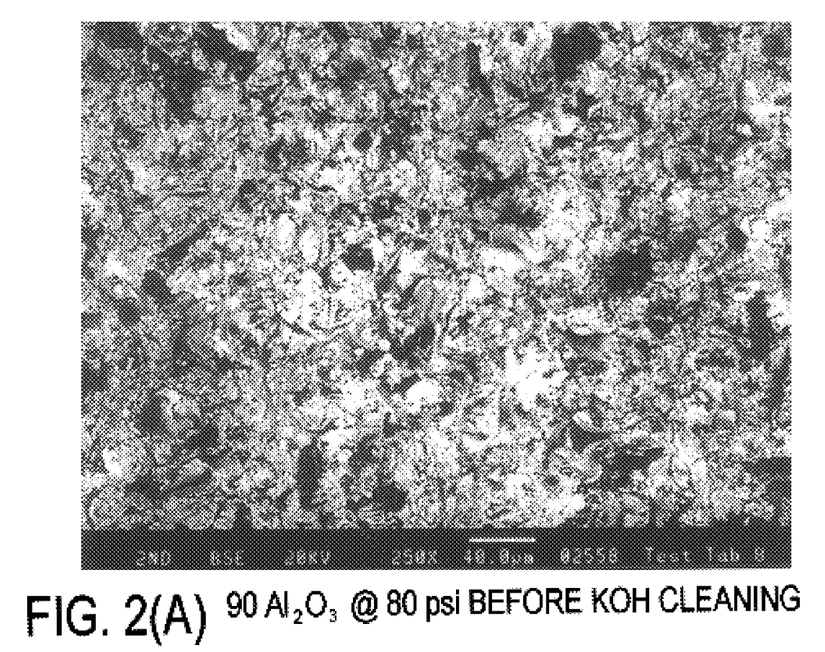
FIGS. 2A and 2B are photomicrographs at 250X of MarM-247 nickel base superalloy samples grit blasted at high air pressure using #90 alumina grit with FIG. 2A being before immersion and FIG. 2B being after immersion in a caustic grit removal bath pursuant to the present invention.
Figure 2B:
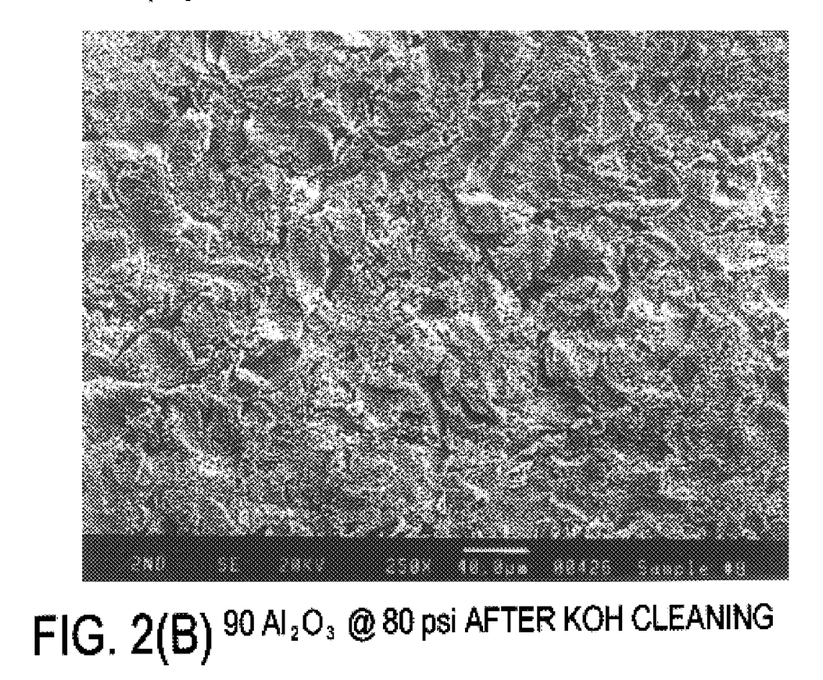
Figure 3A:
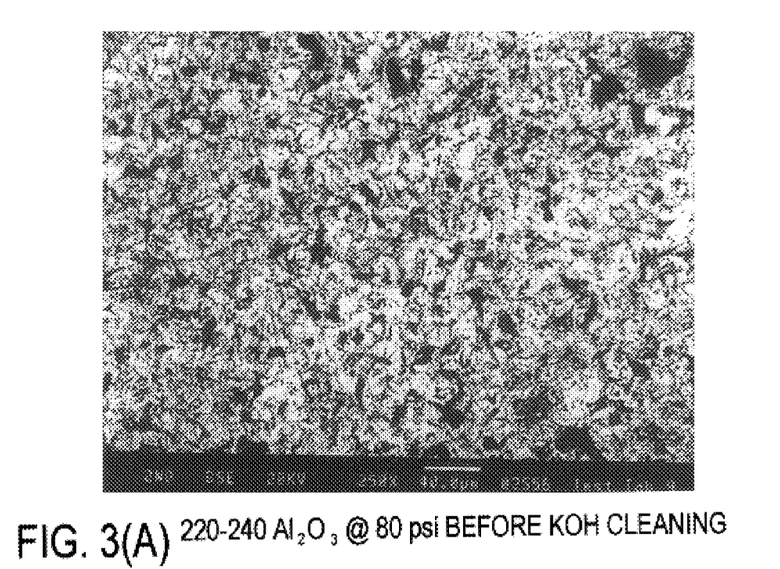
FIGS. 3A and 3B are photomicrographs at 250X of MarM-247 nickel base superalloy samples grit blasted at high air pressure using #220 alumina grit with FIG. 3A being before immersion and FIG. 3B being after immersion in a caustic grit removal bath pursuant to the present invention.
Figure 3B:
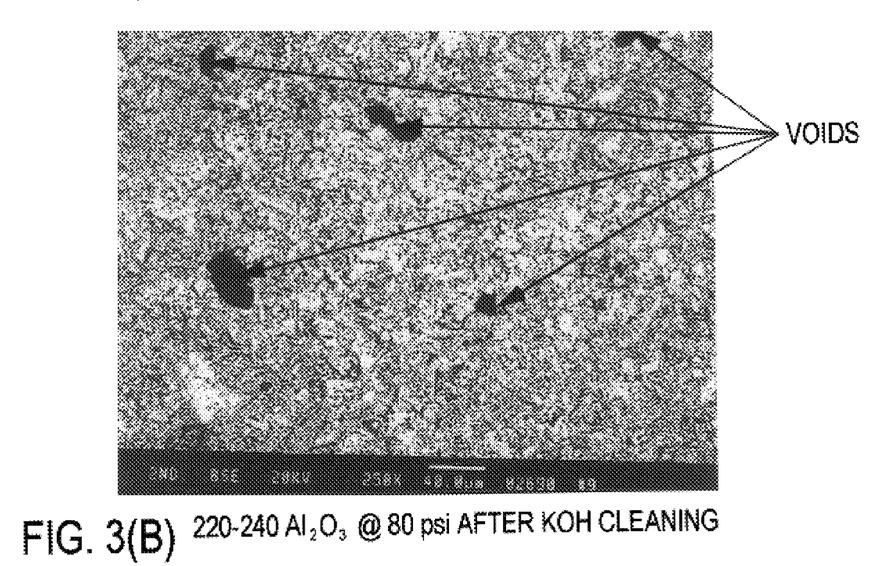

In the grit blasted condition of FIGS. 1A, 2A, and 3A, the embedded grit appears as dark gray areas. After treatment in the KOH bath of FIGS. 1B, 2B, and 3B, the black spots comprise voids created by removal (dissolution) of the entrapped grit particles. A comparison of the surface micrographs before and after the treatment in the KOH bath indicates that substantially all embedded alumina grit particles have been removed from the surface. Subsequent detailed SEM surface point analysis of the test tabs after immersion in the KOH bath confirmed this observation. Importantly, there was no evidence of chemical attack or degradation of the nickel base superalloy tabs by the KOH bath treatment.

The production simulation testing processes using production superalloys involved grit blasting test tabs of CMSX-4 and MarM-247 nickel base superalloys at 50 plus or minus 10 psi carrier air pressure with 220 mesh (ANSI Specification B74.12) alumina grit particles at an acute angle of incidence prior to a low activity CVD deposition of an outwardly grown diffusion aluminide coating on the tabs using aluminizing parameters set forth in U.S. Pat. No. 5,658,614, the teachings of which are incorporated herein by reference. In addition, other production simulation testing involved grit blasting test tabs of MarM-509 cobalt based superalloy and Rene '80 and IN-738 nickel base superalloys at 80 psi air pressure with 16 mesh alumina grit particles at a 90 degree angle of incidence prior to HVOF deposition of a CoNiCrAlY overlay coating on the tabs. Angle of incidence refers to the angle that the grit particles are directed to strike the surface of the test tabs. SEM examinations of the test tabs'surfaces were conducted.

Figure 4A:
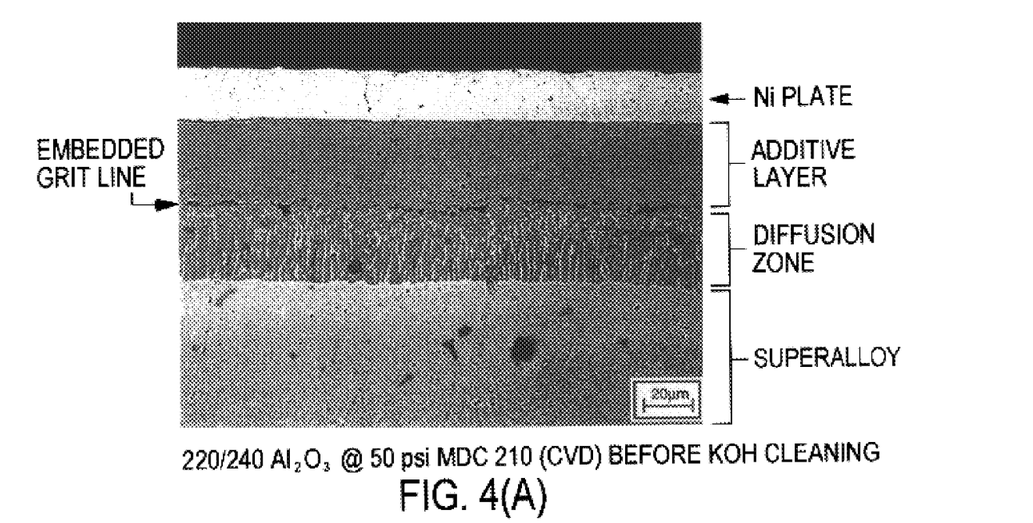
FIGS. 4A and 4B are photomicrographs at 500X of MarM-247 nickel base superalloy samples CVD aluminized to form an outwardly grown diffusion aluminide protective coating, FIG. 4A showing the cross-section of the diffusion aluminide coating with grit blasting prior to aluminizing and FIG. 4B showing the cross-section of the diffusion aluminide coating with grit blasting followed by the chemical grit removal treatment of the invention prior to aluminizing.
Figure 4B:
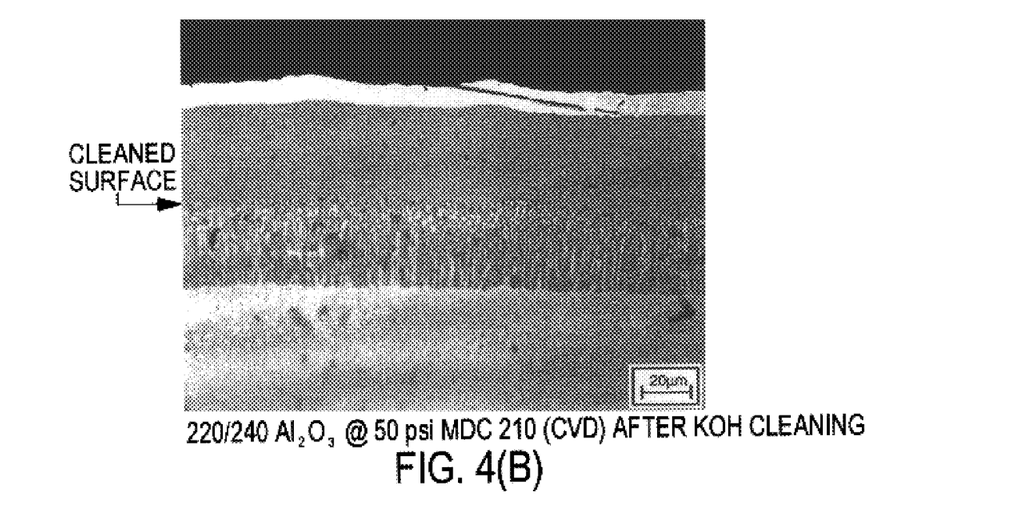

FIGS. 4A and 4B are photomicrographs at 500X of MarM-247 nickel base superalloy samples CVD aluminized to form an outwardly grown diffusion aluminide protective coating. FIG. 4A shows a typical cross-section of the diffusion aluminide coating with grit blasting prior to aluminizing but without the grit removal treatment in the KOH bath. FIG. 4B shows a typical cross-section of the diffusion aluminide coating with grit blasting followed by the chemical grit removal treatment of the invention prior to the low activity CVD aluminizing.

Figure 5A:
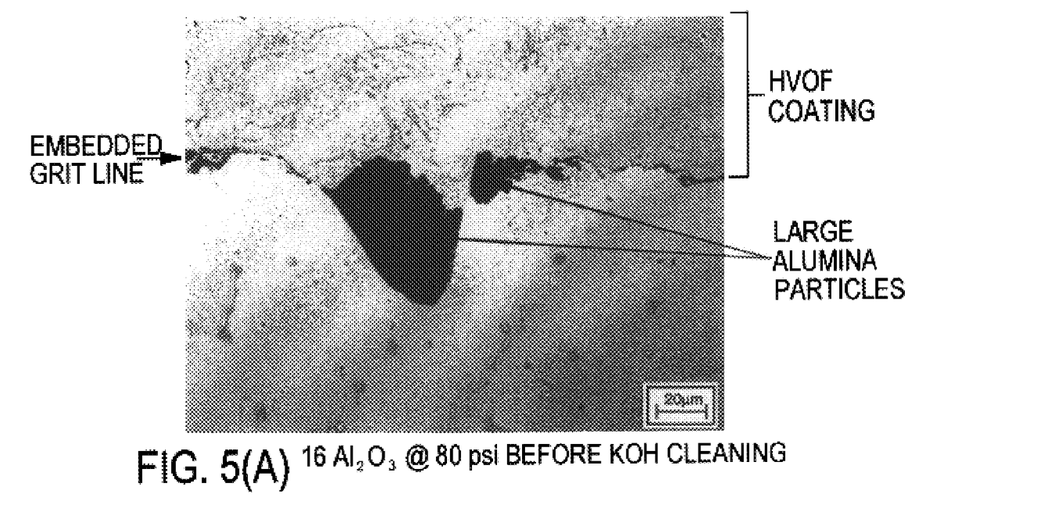
FIGS. 5A and 5B are photomicrographs at 500X of IN 738 nickel base superalloy samples HVOF MCrAlY coated, FIG. 5A showing the cross-section of the MCrAlY coating with grit blasting prior to coating and FIG. 5B showing the cross-section of the MCrAlY coating with grit blasting followed by the chemical grit removal treatment of the invention prior to coating.
Figure 5B:
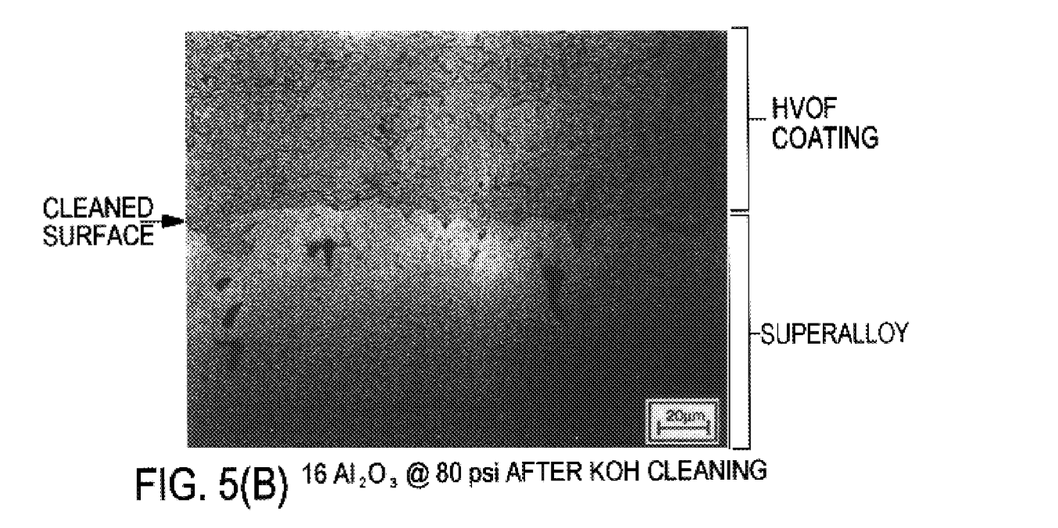

FIGS. 5A and 5B are photomicrographs at 500X of IN 738 nickel base superalloy samples HVOF MCrALY coated. FIG. 5A shows a typical cross-section of the MCrAlY coating with grit blasting prior to coating but without the grit removal treatment in the KOH bath. FIG. 5B shows a typical cross-section of the MCrAlY coating with grit blasting followed by the chemical grit removal treatment of the invention prior to HVOF coating.

Figure 6A:
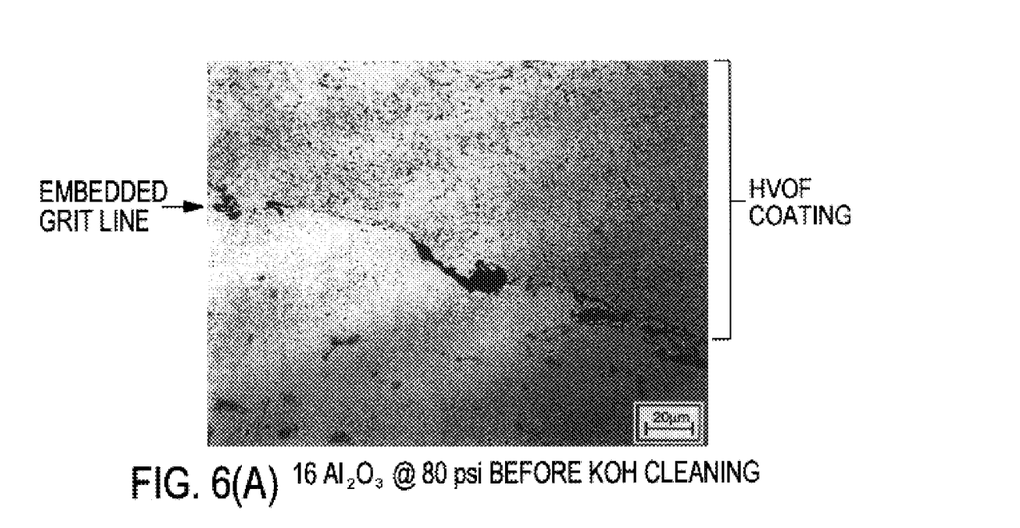
FIGS. 6A and 6B are photomicrographs at 500X of Rene '80 nickel base superalloy samples HVOF MCrAlY coated, FIG. 6A showing the cross-section of the MCrAlY coating with grit blasting prior to coating and FIG. 6B showing the cross-section of the MCrAlY coating with grit blasting followed by the chemical grit removal treatment of the invention prior to coating.
Figure 6B:
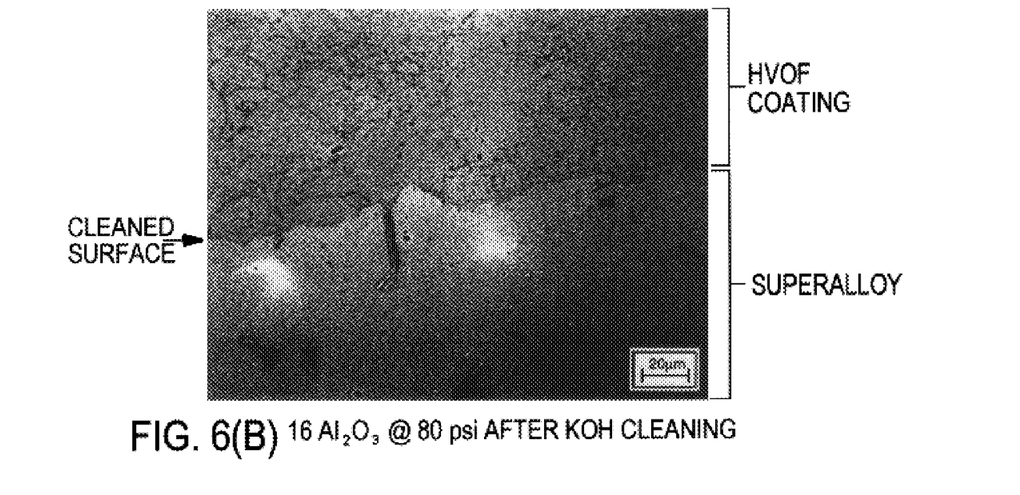

FIGS. 6A and 6B are photomicrographs at 500X of Rene '80 nickel base superalloy samples HVOF MCrAlY coated. FIG. 6A shows a typical cross-section of the MCrAlY coating with grit blasting prior to coating but without the grit removal treatment in the KOH bath. FIG. 6B shows a typical cross-section of the MCrAlY coating with grit blasting followed by the chemical grit removal treatment of the invention prior to HVOF coating.

The benefits of the grit removal treatment of the invention are readily apparent by comparison of the surface photomicrographs. In particular, the grit removal treatment in the KOH bath described above effectively eliminated entrapped alumina grit particles from the outwardly grown diffusion aluminide coating of FIG. 4B and the CoNiCrAlY overlay coatings of FIGS. 5B and 6B with the coatings being substantially free of voids. Moreover, elimination of entrapped grit particles from the coatings was achieved without any evidence of chemical attack or degradation of the nickel and cobalt base superalloy surfaces of the Figures. That is, the surfaces of the nickel and cobalt base superalloy test tabs were free of chemical attack by the KOH bath.

The present invention allows component manufacturers to meet specifications for contamination in protective coatings established by gas turbine engine manufacturers and also should improve the resistance of the coated components to fatigue cracking and coating delamination. These benefits of the grit removal treatment can be achieved with abrasive particles other than alumina, particularly silicon dioxide and others that can be dissolved by the KOH bath. Other caustic baths may be used as well to this end and adapted to remove particular abrasive grit as used in a particular manufacturing process and embedded in the surface of the manufactured component.

Although the invention has been described in detail above with respect to certain embodiments, those skilled in the art will appreciate that modifications, changes and the like can be made therein without departing from the spirit and scope of the invention as set forth in the appended claims.

What is claimed is:

1. A method of making a superalloy component, comprising:
    impinging the component with abrasive particles at one or more stages during manufacture such that abrasive particles are embedded in a surface of said component,
    removing said abrasive particles from said surface by immersing the component having the abrasive particles embedded in said surface in a hydroxide medium that is effective to at least partially chemically dissolve said abrasive particles, and
    forming a coating on said surface.

2. The method of claim 1 wherein said particles comprise oxide particles and said medium comprises a hydroxide medium effective to at least partially dissolve said oxide particles.

3. The method of claim 2 wherein the oxide particles are selected from alumina and silicon dioxide.

4. The method of claim 2 wherein the hydroxide medium comprises at least 50 weight % alkali or alkaline earth hydroxide and balance essentially water at a temperature of at least 275 degrees F.

5. The method of claim 1 wherein said hydroxide medium is disposed in a vessel in ambient atmosphere and said component is immersed in said caustic medium.

6. The method of claim 1 wherein said component comprises a cast nickel, cobalt or iron base superalloy component.

7. The method of claim 1 wherein after immersion in said medium, said surface is coated to provide a diffusion aluminide coating thereon.

8. The method of claim 1 including the step of rinsing the component in water after immersion in said hydroxide medium to help remove abrasive particles on said surface that have been partially dissolved.

9. The method of claim 7 wherein said component is grit blasted to roughen its surface, and then immersed in said hydroxide medium followed by coating with said diffusion aluminide coating.

10. The method of claim 1 wherein said surface is coated to provide an MCrAlY overlay coating thereon wherein M is Ni and/or Co and/or Fe.

11. The method of claim 10 wherein said component is grit blasted to roughen its surface, and then immersed in said hydroxide medium followed by coating with said overlay coating.

12. The method of claim 1 wherein said component is cast in a ceramic mold and then impinged with abrasive particles to remove ceramic shell mold material therefrom and then contacted with said hydroxide medium.

13. A method of making a superalloy component, comprising:
    impinging the component with abrasive particles at one or more stages during manufacture such that abrasive particles are embedded in a surface thereof,
    removing said abrasive particles from said surface by immersing the component having the abrasive particles embedded in said surface in a molten hydroxide bath that is effective to at least partially chemically dissolve said abrasive particles, and forming a coating on said surface.

14. The method of claim 13 wherein said molten hydroxide bath comprises molten KOH.

* * * * *